(12) United States Patent
Pavlovic et al.

(10) Patent No.: US 8,362,815 B2
(45) Date of Patent: Jan. 29, 2013

(54) DIGITAL PHASE LOCKED LOOP

(75) Inventors: Nenad Pavlovic, Eindhoven (NL); Jozef Reinerus Maria Bergervoet, Eindhoven (NL)

(73) Assignee: NXP B.V., Eindhoven (NL)

( * ) Notice: Subject to any disclaimer, the term of this patent is extended or adjusted under 35 U.S.C. 154(b) by 111 days.

(21) Appl. No.: 12/978,221

(22) Filed: Dec. 23, 2010

(65) Prior Publication Data

US 2011/0156783 A1    Jun. 30, 2011

(30) Foreign Application Priority Data

Dec. 24, 2009   (EP) ..................................... 09252903

(51) Int. Cl.
*H03L 7/06*   (2006.01)
(52) U.S. Cl. ......................... 327/156; 327/158; 327/161
(58) Field of Classification Search .................. 327/156, 327/158, 161
See application file for complete search history.

(56) References Cited

U.S. PATENT DOCUMENTS

| | | | |
|---|---|---|---|
| 8,193,866 B2 * | 6/2012 | Chang | 331/1 A |
| 2002/0191727 A1 * | 12/2002 | Staszewski et al. | 375/376 |

* cited by examiner

*Primary Examiner* — John Poos
(74) *Attorney, Agent, or Firm* — Kramer & Amado P.C.

(57) ABSTRACT

A digital phase locked loop (300) configured to receive a reference clock signal (302) and a channel control word (308), and to generate an output clock signal (304). The digital phase locked loop comprising an adjustable delay component (306) configured to: receive the reference clock signal (302), apply a time delay to the reference clock signal (302) in accordance with a time delay control signal (316); and provide a delayed reference clock signal (318). The digital phase locked loop further comprising a timing component (320) configured to process the delayed reference clock signal (318) and the output clock signal (304), and generate a first control signal (322) representative of the phase of the output clock signal (304); a reference accumulator (310) configured to receive the channel command word (308) and generate: a second control signal (312) representative of the phase of an intended output clock signal; and the time delay control signal (316) such that the delayed reference clock signal (318) is delayed by a period of time representative of a first portion of the phase of the intended output clock signal. The digital phase locked loop also comprising a controller (314) configured to process the first and second control signals (322, 312), and generate a DCO control signal (326) for setting the frequency of a digitally controlled oscillator (328) in accordance with the first and second control signals (322, 312); and a digitally controlled oscillator (328) configured to generate the output clock signal (304) in accordance with the DCO control signal (326).

16 Claims, 8 Drawing Sheets a)

b)

DIGITAL PHASE LOCKED LOOP

CROSS-REFERENCE TO RELATED APPLICATIONS

This application claims the priority under 35 U.S.C. §119 of European patent application no. 09252903.1, filed on Dec. 24, 2009, the contents of which are incorporated by reference herein.

The present disclosure relates to the field of digital phase locked loops, and particularly, although not exclusively, a digital phase locked loop having a digital to time converter (DTC) for implementing a fractional-N phase locked loop.

A frequency synthesizer is a key building block of wireless transceivers. Strengths associated with deep sub micron CMOS processors like CMOS090/CMOS065 include an increased logic density and high clock speeds. Digitally intensive techniques that can exploit these capabilities are applied in all digital phase locked loop (ADPLL) designs [1]-[2].

Problems associated with known ADPLL designs can include the power consumption of the time to digital converter (TDC) delay line that is running at the output clock frequency, and that during a sampling period the sampling register (one per delay stage) can consume a large current. In addition, an offset can exist between the TDC and the synchronisation circuit that is used to read the counter. Other disadvantages in terms of frequency spurs can be associated with the prior art.

The listing or discussion of a prior-published document or any background in the specification should not necessarily be taken as an acknowledgement that the document or background is part of the state of the art or is common general knowledge.

According to a first aspect of the invention, there is provided a digital phase locked loop configured to receive a reference clock signal and a channel command word, and to generate an output clock signal, the digital phase locked loop comprising:
  an adjustable delay component configured to:
    receive the reference clock signal,
    apply a time delay to the reference clock signal in accordance with a time delay control signal; and
    provide a delayed reference clock signal;
  a timing component configured to process the delayed reference clock signal and the output clock signal, and generate a first control signal representative of the phase of the output clock signal;
  a reference accumulator configured to receive the channel command word, and generate:
    a second control signal representative of the phase of an intended output clock signal; and
    the time delay control signal such that the delayed reference clock signal is delayed by a period of time representative of a first portion of the phase of the intended output clock signal;
  a controller configured to process the first and second control signals, and generate a DCO control signal for setting the frequency of a digitally controlled oscillator in accordance with the first and second control signals; and
  a digitally controlled oscillator configured to generate the output clock signal in accordance with the DCO control signal.

The adjustable time delay can be used to improve the quantisation error of the DPLL by enabling the timing component to be used to provide a more accurate signal representative of the phase of the digitally controlled oscillator (DCO) than was possible with the prior art.

The adjustable delay component can be considered as bringing an edge of the delayed reference clock signal closer to an edge of the output of the DCO, therefore the DPLL can achieve an improved bang-bang operation.

The improved performance of one or more digital phase locked loops described herein can be in terms of a reduction in phase noise, and a reduction in any non-linearities. One or more embodiments described herein can be considered as reducing the quantization error of the digital phase locked loop, and making the quantization error independent of a fractional count that may be performed by the digital phase locked loop.

The first portion of the intended output clock signal may represent a value that is less than the quantisation magnitude of the timing component. The quantisation magnitude of the timing component may represent a second portion of the intended output clock signal. The second portion of the intended output clock signal may be an order of magnitude greater than the first portion of the intended output clock signal.

The digital phase locked loop may be a fractional-N phase locked loop.

The first portion of the intended output clock signal may represent a fractional portion of the intended output clock signal, and the timing component is configured to generate the first control signal in accordance with its quantisation magnitude, which is representative of an integer portion of the intended output clock signal.

The adjustable delay component may be a digital to time converter. The digital to time converter may be a Vernier digital to time converter.

The first control signal may be representative of whether the phase of the output clock signal precedes or succeeds the delayed reference clock signal.

The timing component may be a counter or a divider.

The digital phase locked loop may be configured to operate as a bang-bang phase locked loop. The bang-bang phase locked loop may generate less phase error/noise than prior art bang-bang DPLL's.

The adjustable delay component may be configured to apply dynamic element matching (DEM).

The digital phase locked loop may further comprise a digital filter configured to filter the DCO control signal in order to provide a time-averaged value of the DCO control signal for setting the frequency of the DCO. The digital filter may be a loop filter, which may be a low pass filter.

The DPLL may further comprise a processor configured to receive the second control signal and generate a quantisation error signal representative of the quantisation error of the adjustable delay component, and wherein the controller is further configured to process the quantisation error signal in order to generate the DCO control signal. The processor may be a DTC controller.

The digital phase locked loop may further comprise a processor configured to perform a spectral analysis of the DCO control signal in order to determine an average unit element delay of the adjustable delay component, and generate a calibrated time delay control signal in accordance with the channel control word and the determined average unit element delay. The processor may be a DTC controller, or a separate component that can determine the average unit element delay and provide the average unit element delay to a DTC controller.

The controller may be a probabilistic phase detector. One or more parameters of the probabilistic phase detector can be calibrated in accordance with one or more operational characteristics (such as phase error and quantization error of the DTC) of the digital phase locked loop.

The one or more parameters of the probabilistic phase detector include a jitter level and distribution in the digital phase locked loop.

Advantages associated with embodiments of the invention where calibration is performed include an improved performance of the DPLL in terms of a reduced amount of noise as actual component operational characteristics can be taken into account for subsequent operation of the DPLL, such as when it is in a locked mode of operation.

There may be provided a computer program, which when run on a computer, causes the computer to configure any apparatus, including a digital phase locked loop, circuit, system, or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

The computer program may be provided on a computer readable medium such as a disc or a memory device, or may be embodied as a transient signal. Such a transient signal may be a network download, including an internet download.

A description is now given, by way of example only, with reference to the accompanying drawings, in which.

One or more embodiments disclosed herein relate to a digital phase locked loop (DPLL) having an adjustable delay component, which may be a digital-to-time converter (DTC), that can apply a time delay to a reference clock signal to provide a delayed reference clock signal. The adjustable time delay can be used to improve the quantisation error of the DPLL by enabling a timing component such as a counter to be used to provide a more accurate signal representative of the phase of the digitally controlled oscillator (DCO) than was possible with the prior art. The digital phase locked loop can operate with "bang-bang" functionality.

The adjustable delay component can be considered as bringing an edge of the delayed reference clock signal closer to an edge of the output of the DCO, therefore the DPLL achieves the bang-bang operation while still operating in fractional-N mode (multiplier value is smaller than the quantisation magnitude of the timing component).

The improved performance of one or more digital phase locked loops described herein can be in terms of a reduction in phase noise, and a reduction in any non-linearities. Non-linearities can cause problems in terms of signal to noise performance when the output signal is down converted. In some examples, the reduction in the frequency spur levels that are achievable with embodiments of the invention can enable Bluetooth standards to be satisfied, which may not have been possible with prior art digital phase locked loops.

One or more embodiments described herein can be considered as reducing the quantization error of the digital phase locked loop, and making the quantization error independent of a fractional count that may be performed by the digital phase locked loop.

Figure 1:
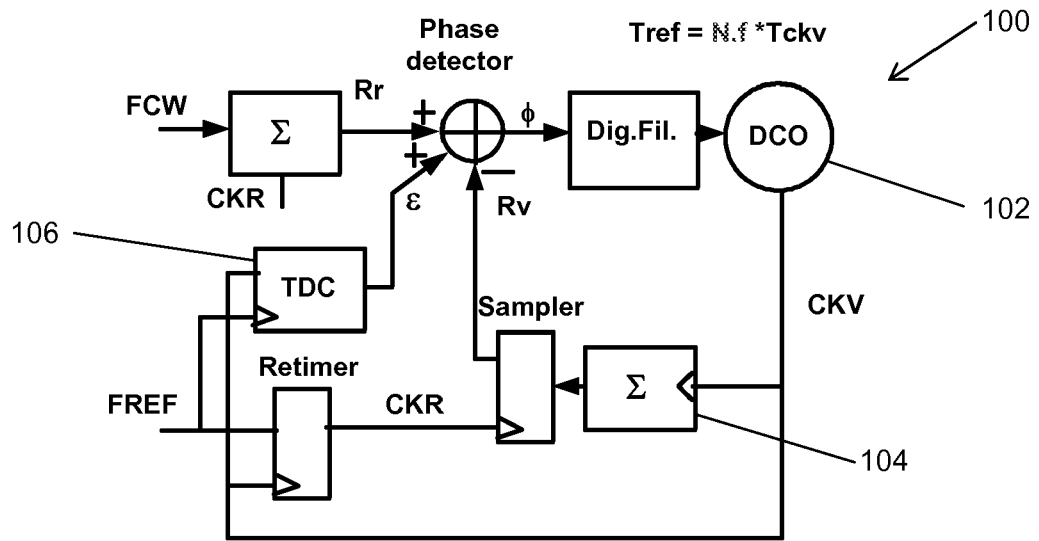
FIG. 1 illustrates a prior art example of an all digital phase locked loop (ADPLL) architecture.

FIG. 1 illustrates a prior art example of an all digital phase locked loop (ADPLL) architecture 100.

The main blocks of the ADPLL 100 are the digital controlled oscillator (DCO) 102, the high frequency accumulator 104 and the time to digital converter (TDC) 106.

For digital phase locked loops (DPLL's), the phase information is converted from the time domain to the digital domain. The integer part of the conversion (full cycles of the DCO clock) is performed with the high speed accumulator 104, while the fractional error is measured by the TDC 106. The phase error in the digital domain allows for a digital implementation of the loop filter.

Further details of a prior art ADPLL are provided in the paper: "Phase-Domain All-Digital Phase-Locked Loop" by Robert Bogdan Staszewski and Poras T. Balsara (IEE transactions on circuits and systems-II; express briefs, vol. 52, no. 3, March 2005).

An implementation of a fractional phase detector using a direct time conversion is reported in [3]. The TDC measures the time difference between FREF and CKV clock edges. The TDC output is then normalised in order to combine it with the integer part from the accumulator. The fractional phase detector described in [3] uses the timing of both falling and rising edges of the CKV clock to measure the CKV period, and a graphical representation of the CKV period estimation is shown as FIG. 2 of this disclosure.

Figure 2:
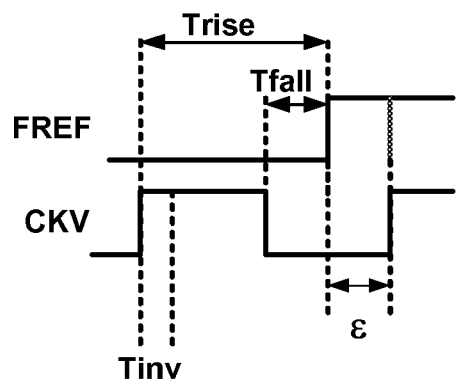
FIG. 2 illustrates a graphical representation of output clock period estimation.

As shown in FIG. 2, the delay of a single delay element is represented by $T_{inv}$. The DCO period can then be calculated from:

$$T_{CKV}/2 = (n_{rise} - n_{fall}) T_{inv}.$$

Where $T_{rise} = n_{rise} T_{inv}$, and $T_{fall} = n_{fall} T_{inv}$.

Figure 3:
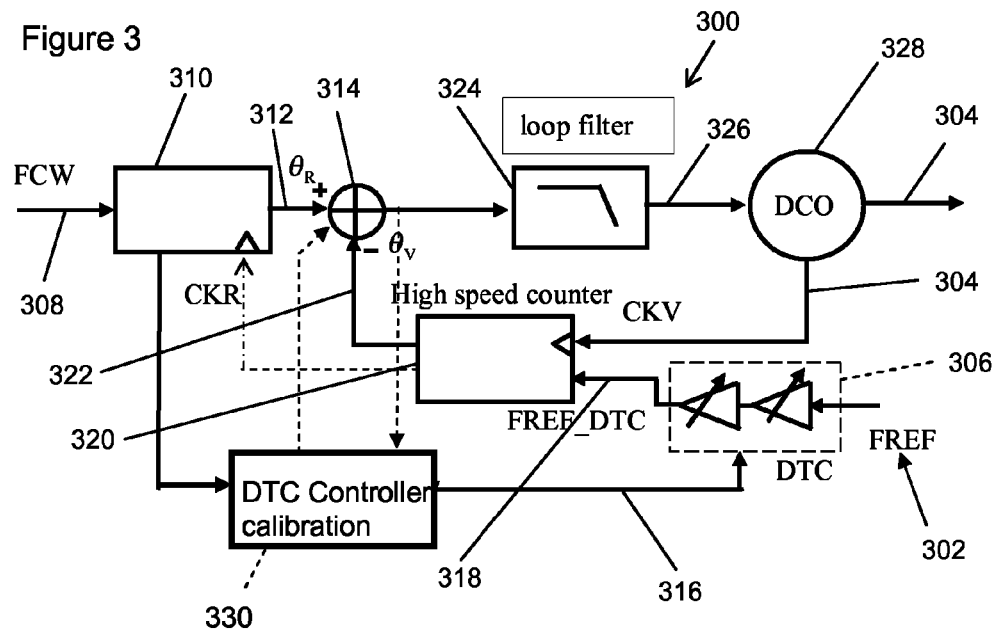
FIG. 3 illustrates a digital phase locked loop according to an embodiment of the invention.

FIG. 3 illustrates a digital phase locked loop 300 according to an embodiment of the invention. The digital phase locked loop (DPLL) 300 receives a reference clock signal FREF 302 and generates an output clock signal 304. The DPLL is configured to apply a multiplier value to the received reference clock signal 302 in order to provide the output clock signal 304. In this example, the DPLL is a fractional-NPLL, and therefore the multiplier value comprises an integer portion and a fractional portion.

The DPLL also receives a frequency controlled word (FCW) 308, which, as known in the art, represents the multiplier value that is to be applied to the reference clock signal 302:

$$FCW = f_{dco}/f_{ref} = N.F$$

The FCW 308 is an example of a channel control word, and is provided to a reference accumulator component 310 such that, at each reference clock cycle, the ratio of the wanted channel frequency $f_{dco}$ and the reference frequency $f_{ref}$ is accumulated in the reference accumulator 310.

The reference accumulator 310 provides a second control signal $\theta_R$ 312 that is representative of the phase of the intended/desired output clock signal. The second control signal $\theta_R$ 312 is provided to a positive input of a phase detector component 314, which is an example of a controller.

The reference accumulator 310 also gives the phase information about the output clock signal to the DTC controller 330 that generates a time delay control signal 316 that is provided to an adjustable delay component 306. In this example, the time delay control signal 316 is representative of a fractional portion of the accumulated reference, but expressed in the unit element delay. For example, if the multiplier value is 100.1, then the accumulated fractional portion will be 0.1 for a first output clock pulse, 0.2 for a second output clock pulse, 0.3 for a third output clock pulse, etc. The DTC controller will calculate needed delay first in the normalized domain of counter as $$\theta_{delay} = 1 - \theta_{R,f}$$

and then calculate the control word for the DTC in units of the unit element delay that are required to implement the delay.

$$DTC_{control} = \theta_{delay} * T_{dco} / T_{unit\ delay}$$

In the prior art the fractional phase information is measured with a TDC, while embodiments of this invention the fractional phase information is used a priori to calculate delay, thus only coarse measurement with counter is needed while achieving the same quantization error.

In this example, the adjustable delay component 306 is a digital to time converter (DTC), although in other embodiments different time delay elements/components can be used.

The adjustable delay component 306 receives the reference clock signal 302, and provides a delayed reference clock signal FREF_DTC 318 that represents the original reference clock signal 302 delayed in accordance with the time delay control signal 316.

In this example, the adjustable delay component 306 is configured to apply a delay to the reference clock signal 302 such that a fractional portion of the intended output clock signal can be introduced before the counter 320 operates on the output clock signal 304. That is, the negative effects of the quantisation error of the counter 320 can be reduced because the adjustable time delay component 306 has a lower quantisation error and therefore can enable the phase of the output signal 304 to be more accurately measured.

The delayed reference clock signal 318 is provided to a high speed counter, which is an example of a timing component, along with the output clock signal CKV 304. In other examples, a divider could be used as the timing component, as is known in the art.

The counter 320 is configured to process the output clock signal 304 and the delayed reference clock signal 318 in order to provide a first control signal $\theta_V$ 322 representative of the phase of the output signal 304. The first control signal $\theta_V$ 322 generated by the high speed counter 320 is provided to a negative input of the phase detector 314.

The phase error is calculated in the following way $$\varphi_e = [\{\theta_{bang\_bang} + \theta_R - \theta_V + N/2\} \bmod N] - N/2$$

Where N is modulus of the counter.

In the locked state, the first control signal $\theta_V$ 322 has the same value as the second control signal $\theta_R$ 312 that is provided by the reference accumulator 310 when the output clock signal 304 is later than the delayed reference clock signal 318. Alternatively, when the output clock signal 304 is ahead of the delayed reference frequency signal 318 the first control signal $\theta_V$ 322 will have a value that is one more than the value of the second control signal 312. The phase detector generates an output signal representative of an error (early/later) between the intended and actual phase of the output clock signal. The phase detector output is also influenced by the system jitter. The $\theta_{bang\_bang}$ is an expectation of the counter output that depends on the jitter level in the system and on the quantization error in the DTC control.

The output of the phase detector 314 is provided to a loop filter 324 that can time-average the output signal of the phase detector 314 in order to generate a DCO control signal 326. The DCO control signal 326 is then provided to the digitally controlled oscillator (DCO) 328 in order to adjust the frequency of the DCO 328 as appropriate. It will be appreciated that a time averaged value of the output of the phase detector 314 can provide a more stable DCO control signal 326 representative of how the frequency of the DCO 328 should be changed.

In some embodiments, the loop filter 324 may not be required, and the output of the phase detector 314 can be provided directly to the DCO 328.

In this example, the PLL 300 is a fractional-N PLL, and the high speed counter 320 has a quantization magnitude that corresponds to the integer value of the reference accumulator. That is, the high speed counter 320 by itself could be used to measure the phase of the DCO 328 in accordance with an integer portion of the reference accumulator. The time measurement would generate non-linearities when applying a fractional multiplier value. The adjustable delay component 306 is used to implement the complement of the fractional portion of the reference accumulator thereby reducing/eliminating any non-linearities.

Consider a DPLL similar to that of FIG. 3, but without the adjustable delay component 306. If such a DPLL were used to implement a fractional-N PLL with a multiplier value of 100.1, the first control signal 322 generated by the counter 320 would be different to the second control signal 312 generated by the reference accumulator for 9 reference periods until the accumulated error reaches the quantisation magnitude of the counter 320. This systematic error would cause a non-linearity in the output signal, thereby generating fractional spurs Taking the same example with a multiplier value of 100.1 with the DPLL of FIG. 3, whereby the DTC 306 has a resolution equal to 0.1 of the period of the DCO (counter resolution), it will be seen that the phase noise can be reduced when compared with the prior art.

Assuming that any calibration and locking algorithm have already been performed, and that the state of the reference accumulator and counter are zero, on the first CKR clock pulse, the reference accumulator 310 will generate a second control signal 312 representative of accumulated value of 100.1 and the DTC controller will generated a timing delay control signal 316 that should cause the reference frequency signal 302 to be delayed by 0.9 times the period of the DCO clock. This means that, at the end of the first update period, the output clock signal 304 can be compared with a delayed reference signal that exactly corresponds with the intended output clock signal, and therefore the phase detector output is zero meaning that DCO is phase locked to the reference signal.

Similarly, for a second reference clock period, the reference accumulator 310 value will be 200.2 (100.1×2), and the generated time delay control signal will delay FREF 302 by 1−0.2=0.8 of the DCO period. In the same way as described above, the output clock signal 304 can be compared with a delayed reference signal that exactly corresponds with the intended output clock signal, and therefore the actual output clock signal 304 can be kept exactly in time with the intended output clock signal.

It will be appreciated that even if the DTC 306 did not have a quantisation error that enabled FREF 302 to be delayed such that it exactly matched with the intended output clock signal, providing a DTC 306 with a smaller quantisation error than the counter 320 can enable the phase noise associated with the output signal 304 to be reduced.

One or more embodiments disclosed herein can be considered as introducing an adjustable delay component such that the effective quantization error/magnitude of other components in the circuit (such as the counter 320) can be reduced, and therefore multiplier values can be more accurately applied, with a reduction in phase noise, when compared with the prior art.

Figure 4:
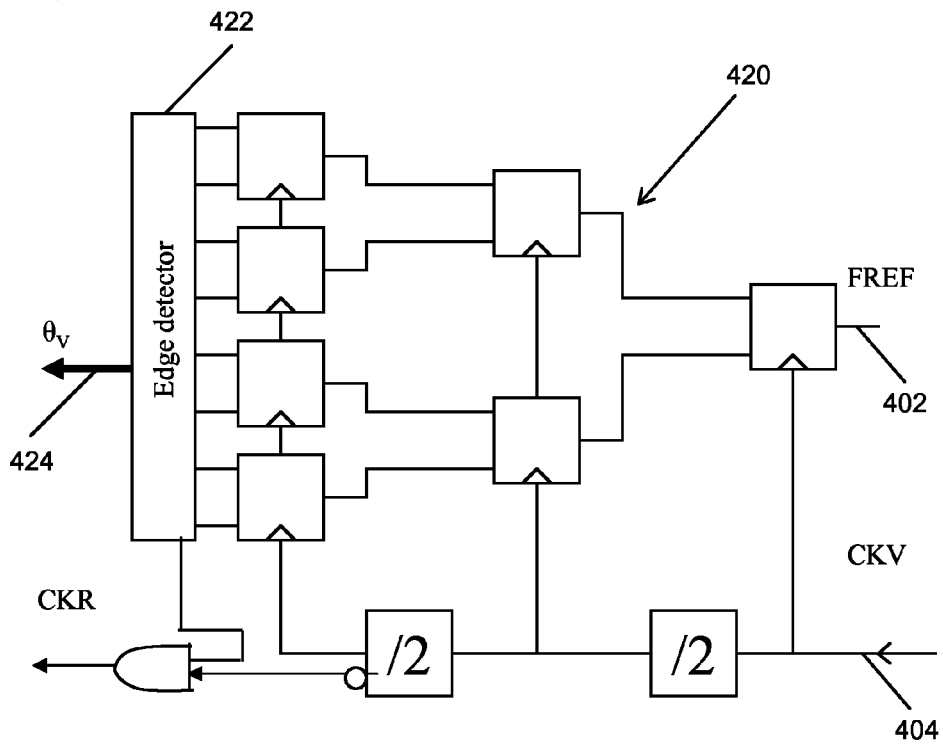
FIG. 4 illustrates a counter according to an embodiment of the invention.

FIG. 4 shows an example of a counter 420 according to an embodiment of the invention. The counter receives the reference clock signal 402 as a first input, and the DCO output clock signal 404 as a second input. The counter 420 of FIG. 4 is configured to sample the reference clock signal 402 with the output clock signal 404, demultiplex the samples, and then use an edge detector 422 to generate the synchronized frequency reference clock CKR and the first control signal 424. The synchronized frequency reference clock signal CKR is used as clock for the reference accumulator 310 of the DPLL of FIG. 3, in order to update the reference accumulator 310 and also for DPLL loop calculation.

As indicated above, the adjustable time delay 306 shown in FIG. 3 will also have a quantization magnitude/error, and one or more embodiments of a DPLL disclosed herein can take into account the quantization error of the adjustable time delay 306 in order to further improve the performance of the DPLL.

In some embodiments, the adjustable time delay can be implemented as a delay line, and in such examples, mismatch between unit elements can exist. The level of fractional spurs in an output signal can depend on the differential non-linearity (DNL) of the unit elements in the adjustable delay component. In some examples, it may be possible to calibrate the adjustable time delay component with respect to the period of the output clock signal or to calibrate the average delay of the unit delay element.

One way to implement the adjustable delay component is by cascading a number of delay elements, and by tapping the outputs. In such examples, the elements may not be capable of being exchanged to produce a similar delay, and the dynamic element matching (DEM) may not be implemented. The absolute delay measurement of each element, by using DTC configured as ring oscillator, would not be possible as the ring oscillator would produce high frequency outside the measurement range of the high speed accumulator.

For background calibration of the DTC, the DPLL may need to be operated in a fractional mode in order to measure differential non-linearities of each bin. Such calibration can suffer from the fact that the DPLL can react on the differential non-linearities of the delay line during calibration.

Figure 5:
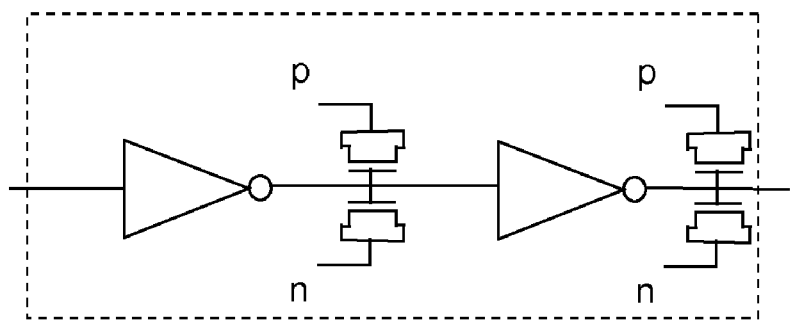
FIG. 5 illustrates an adjustable delay component according to an embodiment of the invention.
Figure 5:
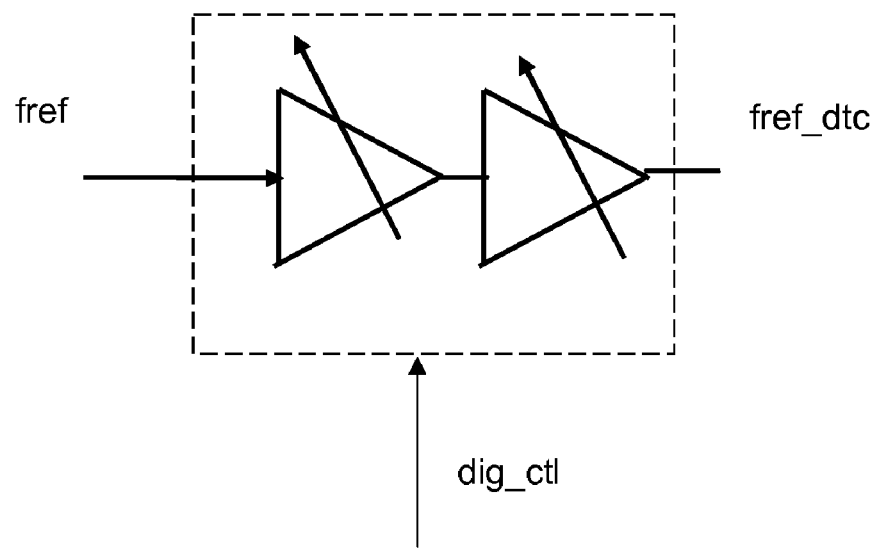

In order to address the one or more issues described above, the adjustable delay component can be provided by a digital to time converter (DTC) constructed from a cascade of Vernier elements [4], as shown in FIG. 5.

The delay of each Vernier element can be expressed as:

$$T_{bin,n} = (1+DNL_{bin,n})T_{LSB} + T_{common}$$

Where $T_{LSB}$ is Vernier delay. The delay can be changed by switching capacitors and/or through supply pins. The Vernier element can also be implemented with two halves with different delays and an output multiplexer to select one of those parts [5]. The Vernier common delay $T_{common}$ may not be considered as important for embodiments of the DPLL disclosed herein, as it is added to the global delay of the reference clock signal.

FIG. 5a illustrates an example Vernier element, and FIG. 5b illustrates an example delay line with Vernier elements.

In some examples, the DTC can have coarse and fine delay elements. Fine delay elements may be used for calibration, and when the reference jitter is not sufficient to cover the quantization step of the coarse element, the fine elements can be used for extra reference dither in some examples.

For open loop absolute time calibration of the dithering element, the DTC can be configured in a similar way to a ring oscillator. The frequency can be measured by a high speed counter. During a calibration period, $1/f_{cal}$, determine by a stable reference clock, the number of periods of the oscillator, $N_1$ and $N_2$ is measured with the dithering element in on/off state. The delay of the dithering element can be calculated as:

$$t_{dither} = \frac{1}{2*f_{cal}}\left(\frac{1}{N_1} - \frac{1}{N_2}\right)$$

A similar procedure can be used to calibrate other bins in the DTC as the dithering element can be interchanged with the calibrated bin without significantly changing the ring oscillation frequency. The DTC unit delay can be physically calibrated based on this information.

Further still, the calibration procedure can be used to calibrate the average delay of the unit element of the DTC when the correction of each element is not required.

As discussed above, the adjustable delay component can be used to achieve the phase measurement accuracy that cannot be satisfactorily achievable with other components (such as the counter) in prior art DPLL's. The adjustable delay component can be considered as bringing the edges of the reference clock signal closer to the edges of the output clock signal for processing by the counter. Such functionality is illustrated in FIG. 6.

Figure 6:
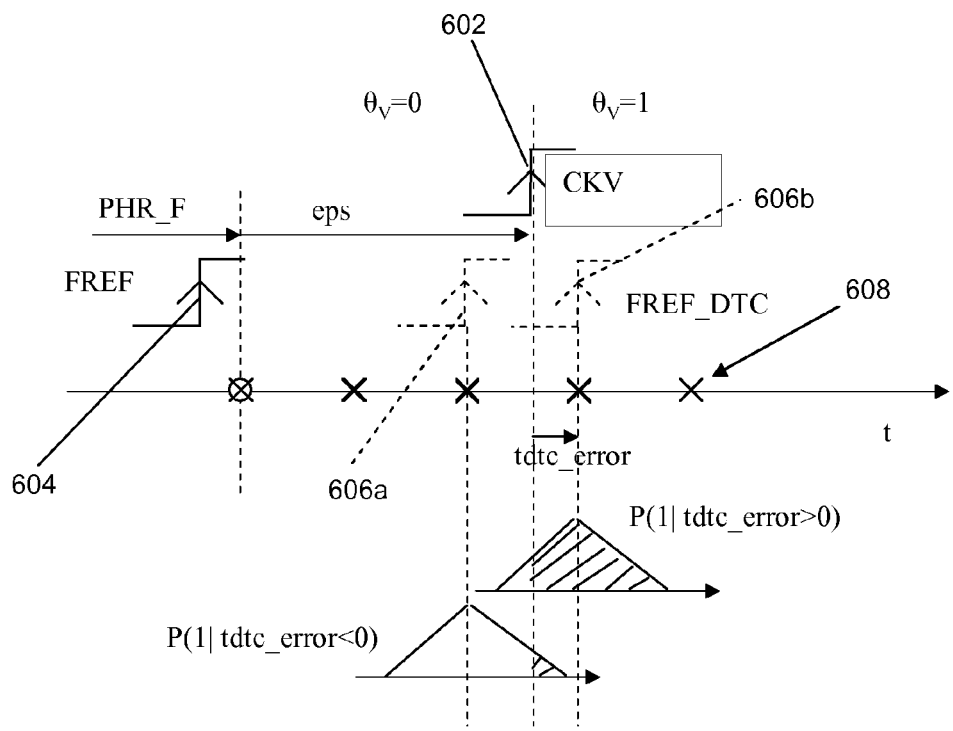
FIG. 6 illustrates a timing diagram illustrative of the use of an adjustable delay component according to an embodiment of the invention.

FIG. 6 represents a timing diagram illustrative of the use of a DTC as the adjustable time delay component. An edge of the output clock signal is shown in FIG. 6 with reference 602, and an edge in the (undelayed) reference control signal is shown with reference 604 in FIG. 9.

The time axis illustrated in FIG. 6 includes a number of "X" symbols 608 that represent discrete delay periods of time that can be implemented by the adjustable delay component. As an example, two potential edges of a delayed reference clock signal are shown with dashed lines in FIG. 6 with references 606a, 606b. As illustrated in FIG. 6, the two potential edges of the delayed reference clock signal 606a, 606b are those that are immediately before and after the output clock edge 602.

Expected fractional positions of the reference edges (with respect to output clock edges) that are shown with reference 604 in FIG. 6 are available from the reference accumulator, and therefore the required delay for each jump between the original reference edges to positions of the delayed reference clock signal closest to the output clock edges are known.

Using the estimated unit delay, the DTC controller can calculate the appropriate digital word for the time delay control signal that will cause the DTC to provide the required time delay. In a locked mode, the DPLL forces the output clock signal edges to follow the delayed reference clock signal edges in accordance with the phase detector described above.

As the resolution of the DTC is smaller than the resolution of the counter, the DPLL phase noise can be improved when compared with an architecture without the DTC.

The operation of the DTC based DPLL can be considered to resemble the phase noise cancelling fractional-NPLL, but with a digital phase detector. The architecture of one or more embodiments of the invention can eliminate the need for narrow-band filtering to suppress the quantization noise of a programmable divider that may be required with an analogue fractional-NPLL.

As is known in the art, mismatch between unit elements of a delay line implementation of a DTC can exist, and this can lead to non-linearities in the output of the DPLL. The level of the DPLL fractional spurs can depend on the differential non-linearities (DNL) of the elements of the DTC. The fractional spurs can be reduced with proper calibration of the unit element delay, and examples of open loop calibration procedures are described above. According to some embodiments of the invention, a background calibration procedure for the delay element calibration can also be used.

The DTC based DPLL can be considered as operating in the bang-bang mode. A drawback with bang-bang PLL's is the PLL bandwidth dependency on the input jitter. The bandwidth can be controlled by adding extra high-pass filtered noise to the reference signal and/or the overall loop gain can be controlled to compensate for the transfer function variation.

The unit delay calibration is based on spectral analysis of the phase detector output for the frequency where the fractional spur is expected to exist. The estimation of the delay is updated in such a way as to lower the fractional spur. The mapping of delay code can be performed with dynamic element matching (DEM) in order to randomise quantization error due to DTC integral non-linearities (INL).

The jitter calibration can be performed using an S-detector (probabilistic detector) and sign-error LMS algorithm. By applying these calibrations, the level of fractional spurs in the DPLL can be further reduced.

Figure 7:
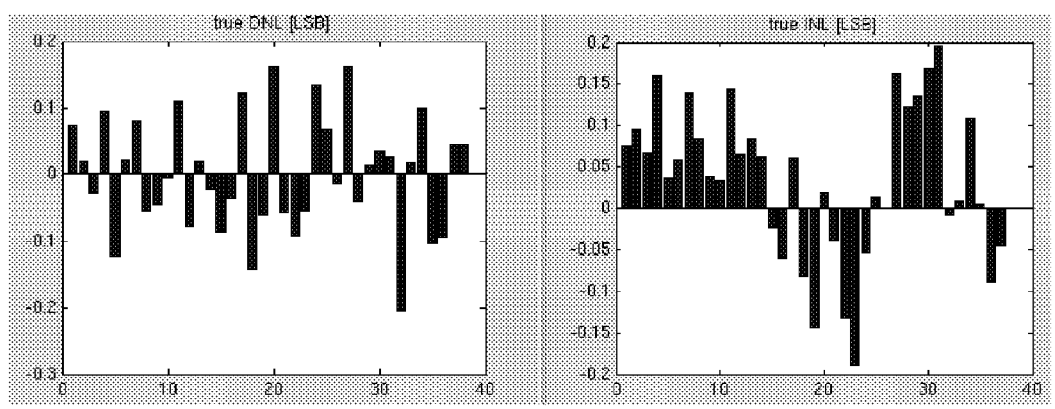
FIG. 7 illustrates differential and integral non-linearities introduced by a DTC with thirty eight levels.

The mismatch between unit elements will introduce non-linearities in the DTC, and FIG. 7 illustrates the differential and integral non-linearities introduced by a DTC with thirty eight levels and mismatch of 8% (seed 1=1111, seed 2=3456 . . . ).

A calibration algorithm according to an embodiment of the invention can determine the average delay of the unit elements, and in order to prevent the output clock signal from following the integral non-linearities of the DTC during calibration, dynamic element matching (DEM) can be used to control the delay line.

Figure 8:
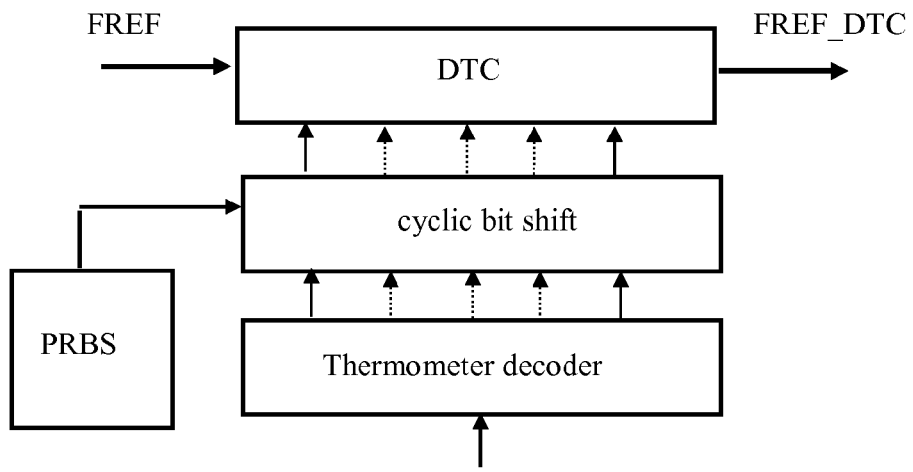
FIG. 8 illustrates a barrel shifter scrambling algorithm according to an embodiment of the invention.

For a Vernier based DTC, the DEM can be implemented with a barrel shifter scrambling algorithm to reduce INL as shown in FIG. 8.

For a given code, the code value for successive elements are selected starting from a random pointer position. When the number of the elements from the pointer position to the end of line is less then the code value, wrapping to the beginning of the sequence of elements is used.

With the DEM block switched on, the integral non-linearities (INL) of each element may not influence the accuracy of the jump to the DCO edge, or at least the influence can be reduced. In the bang-bang mode, the DPLL follows the average delayed version of the reference clock signal. If there is an incorrect estimation of the unit delay of the DTC, the jump will be early/late from the ideal DCO position. As a result, the phase error signal at the input of the loop filter will have fractional spurs. When channel and reference frequency is known, the position of the fractional spur is well defined. The calibration of the DTC unit delay can be based on DTFT measurements of the fractional spurs.

DTC calibration according to an embodiment of the invention may measure a limited number of fractional spurs. Therefore the full FFT may not be required, and the efficient Goertzel algorithm (DTFT) can be used instead. The Goertzel algorithm can be implemented as a second-order IIR filter which provides an output proportional to the power at a given frequency. The Goertzel algorithm computes a sequence, s(n), given an input sequence, x(n) from the phase detector:

$$s(n)=x(x)+2\cos(2\pi\omega)s(n-1)-s(n-2)$$

where $s(-2)=s(-1)=0$ and $\omega$ is fractional spur frequency, in cycles per sample, which should be less than $\frac{1}{2}$. The corresponding power can be computed using:

$$\text{Power}=s(N-2)^2+s(N-1)^2-2\cos(2\pi\omega)s(N-2)s(N-1)$$

Figure 9:
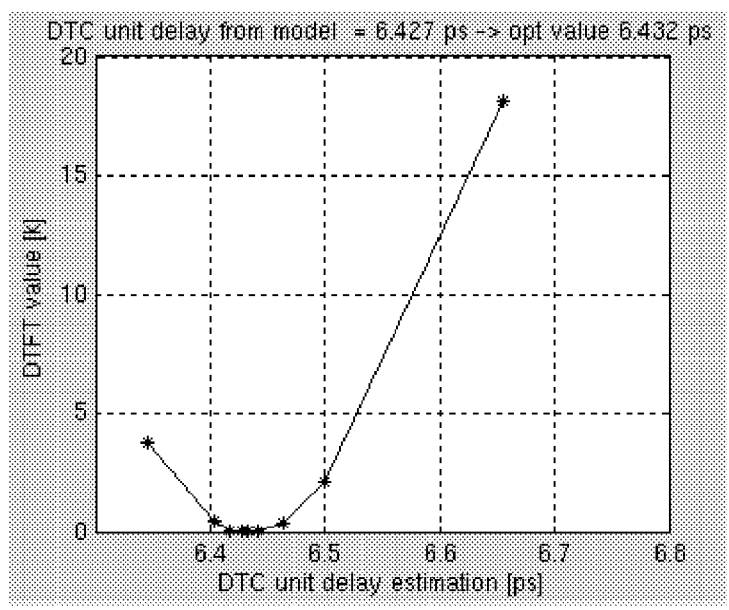
FIG. 9 illustrates how power information can be used in a Brent optimizer to refine an average unit delay estimation.

The power information can be used in a Brent optimizer to refine the average unit delay estimation as shown in FIG. 9. In this example it is assumed that the delay line has +/− 2 LSB INL.

It will be appreciated that other methods to monitor the spectrum are also possible. In one embodiment the odd harmonics of the fractional spur at the output of the filter can be measured in similar way as in a quadrature (IQ) receiver.

One or more embodiments disclosed herein can provide jitter calibration in order to improve the performance of the DPLL.

Depending on the resolution that can be obtained by the DTC, different phase detectors can be used. The general form of the phase detector is $$\phi_e=[\{\theta_{bang\_bang}+\theta_R-\theta_V+N/2\}\bmod N]-N/2$$

where $\theta_R$ and $\theta_V$ are the integer outputs of the reference accumulator and the high speed counter respectively, and correspond to the signals with references 312 and 322 in FIG. 3. N is the modulus of the high speed counter. $\theta_{bang\_bang}$ is the expectation of the counter output that depends on the jitter level in the system. The simple bang-bang operation can be obtained by using $\theta_{bang\_bang}=0.5$. When the quantization step is larger then the jitter in the system the DTC quantization error, $t_{dtc\_error}$ in FIG. 9, can be used in the $\theta_{bang\_bang}$ calculation.

Figure 10:
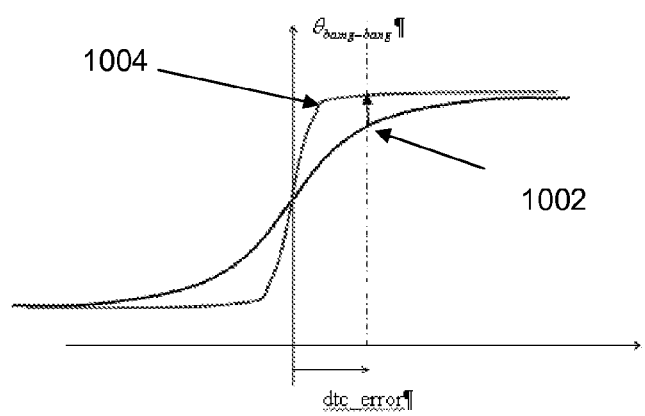
FIG. 10 illustrates graphically a jitter model of a counter output signal.

The counter in the DTC based DPLL (together with reference accumulator) can be considered as functioning as a binary phase detector. The characteristic of the counter output is smoothed out by the jitter. When the estimation of the jitter at the input of the phase detector (counter) exists (both distribution and level) the probability of an early/late decision can be calculated [6]. The jitter model of the counter output for a typical phase detector characteristic (S-detector) is shown in FIG. 10 with reference 1002. The "S-curve" shown in FIG. 10 shows the probability of the counter output in the presence of triangular jitter and quantization error in a delay jump ($t_{dtc\_error}$ normalized to jitter level, $t_{dtc\_dither}$).

This information can be used to soften the interpretation of the hard quantized output of the counter so that the loop is not updated when, due to DTC quantization, the delayed reference edge is far from the DCO edge where the measurement is done. When the parameters of the detector are not correct, spurs will appear in the DPLL (the DTC code depends on the fractional part of $\theta_R$). The position of the spurs depends both on the fractional channel and on the INL of the DTC. The calibration algorithm to measure the input jitter is described below.

The sign-error LMS algorithm can be used to adaptively adjust the $t_{dtc\_dither}$ level estimation. When the jitter level is underestimated, the S-phase detector will overestimate the average counter output $\theta_{bang\_bang}$ which is shown in FIG. 10 with reference 1004. The average value will not be cancelled with the divider output, and an unwanted signal will be injected into the loop filter each reference period. This is shown in FIG. 10, where the nominal transfer function is shown with reference 1002 and an underestimated dither level is shown with reference 1004.

Let us assume that we integrate the phase error that is multiplied with sign of $t_{dtc\_error}$ $$COR(n)=\phi_e(n)sgn(t_{dtc\_error}(n))$$

The output of the loop filter will increase when the $T_{dtc\_dither}$ parameter is underestimated. The filter output can be used in a negative feedback configuration to adjust the S-phase detector parameter.

Figure 11:
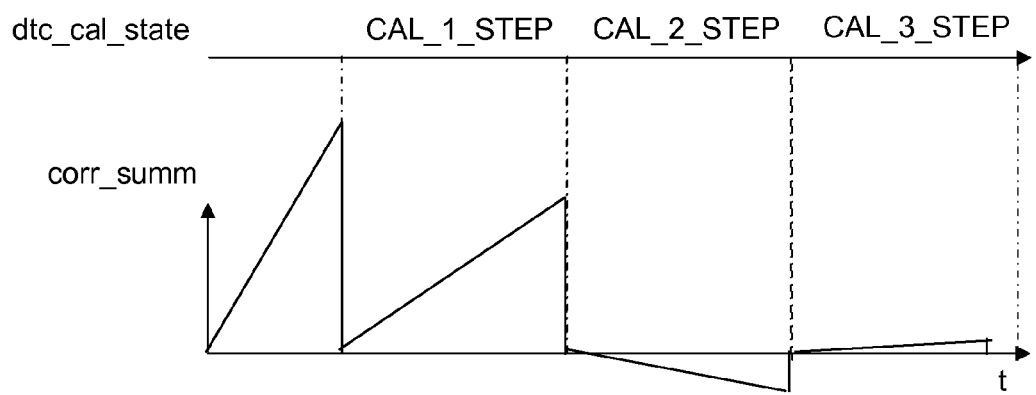
FIG. 11 illustrates the results of a simulation according to an embodiment of the invention.

FIG. 11 shows the output of the S-detector calibration low-pass filter (corr_sum signal). The output is sampled at the end of the integration period $t_{s\_cal}$. The simulation shown in FIG. 11 is performed with the following settings: $f_{channel}$=4812.020507 MHz, $f_{ref}$=48 MHz, $t_{dtc}$=6.5 ps (38 levels in one TDCO), FREF noise: pn=−145 dBc/Hz (sigma=1.29 ps), loop filter: $\alpha_p$=2^−11, $\alpha_p$=2^−17, (−125 dBc/Hz@6 MHz, −20 dB/dec; −57 dBc/Hz@10 kHz −30 dB/dec: OFF, sim time 4 ms, FFT=8 average.

Figure 12:
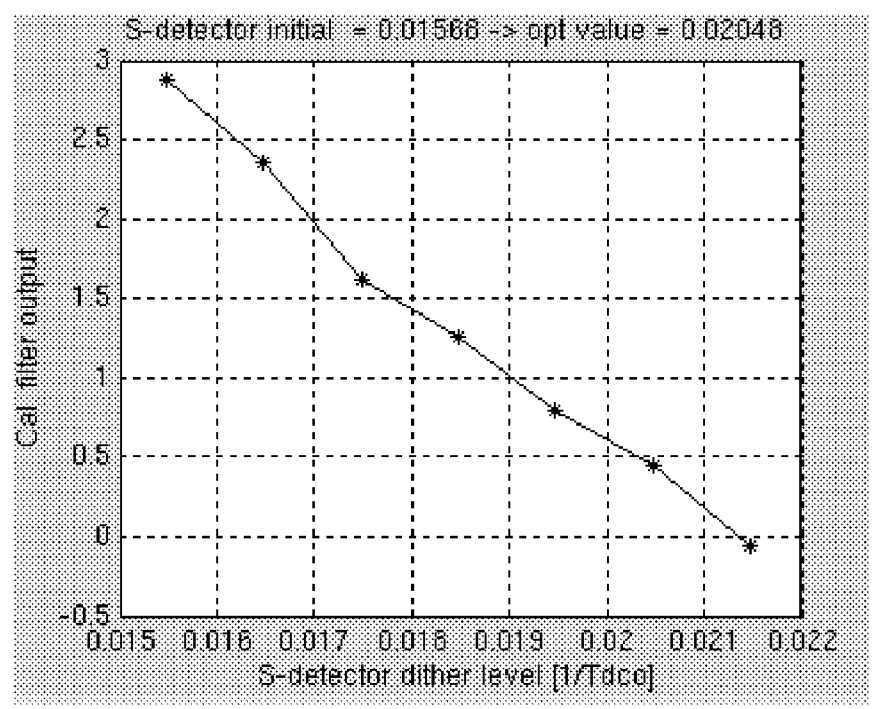
FIG. 12 illustrates the results of a simulation according to an embodiment of the invention.

The slope sign changes when the optimal value of jitter $t_{dtc\_dither}$ is reached, as shown in FIG. 12. The simulation of FIG. 12 is performed with the following settings: $t_{dtc\_dither}$ parameter during calibration. $f_{channel}$=4812.020507 MHz $f_{ref}$=48 MHz $t_{dtc}$=6.5 ps (38 levels in one TDCO), FREF noise: pn=−145 dBc/Hz (sigma=1.29 ps), loop filter: $\alpha_p$=2^−11, $\alpha_p$=2^−17, DCO noise (−125 dBc/Hz@6 MHz, −20 dB/dec; −57 dBc/Hz@10 kHz −30 dB/dec: OFF, sim time 4 ms, FFT=8 average.

Figure 13:
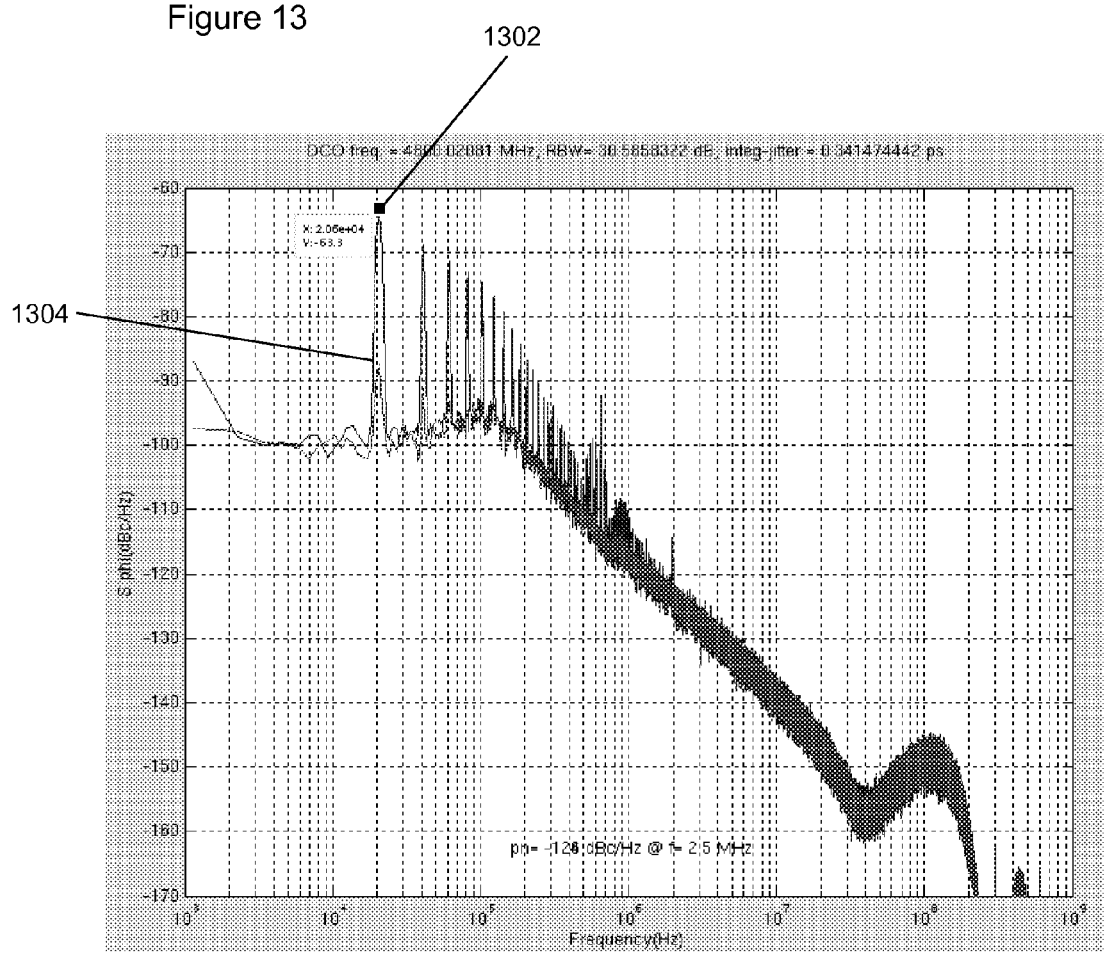
FIG. 13 illustrates the results of a simulation according to an embodiment of the invention.

The influence of calibration on the fractional spurs will be further described with reference to FIG. 13. In some examples, the most critical frequency channels with respect to the spur generation in the DTC based DPLL are those channels close to integer values. When both DTC and S-detector calibration are implemented, the improvement in frequency spurs in shown in FIG. 13. A first line of FIG. 13, with reference 1302, represents the frequency response without calibration, and the line with reference 1304 represents the frequency response with calibration. The improvement in spurs level can be 27 decibels. The simulation of FIG. 13 was performed with the following setting:

Fchannel=4800.02082, $t_{dtc}$=6.5 ps (32 levels in one TDCO), DTC mismatch 8%, FREF noise pn=−145 dBc/Hz (sigma=1.29 ps)

The background calibration algorithm described above can be complemented with one or more of the open-loop algorithms described above, and this can provide a coarse tuning of the DTC through supply by using a programmable low-drop out regulator (LDO).

One or more of the calibration operations/algorithms described above can be performed by a DTC controller, such as the one shown in dashed lines with reference 330 in FIG. 3. Also the calibration function could be implemented in a separate block that is providing the average delay of the DTC unit element to the DTC controller.

One or more embodiments disclosed herein can be used with any digital PLL for various application, such as telecommunications, radio, clocking of high speed ADC/DAC, basestation power amplifier design, phased-array radar systems, etc.

One or more embodiments disclosed herein can be particularly advantageous for providing a DPLL, such as fractional-NDPLL that can provide a reduced phase error when compared with the prior art, over a range of frequency values.

REFERENCES

[1] R. B. Staszewski, D. Leipold, K. Muhammad, and P. T. Balsara, "Digitally controlled oscillator (DCO)-based architecture for RF frequency synthesis in a deep-submicrometer CMOS process," *IEEE Trans. Circuits Sys. II, Analog Digit. Signal Process.*, vol. 50, no. 11, pp. 815-828, November 2003.

[2] Nicola Da Dalt, Edwin Thaller, Peter Gregorius, and Lajos Gazsi, "A Compact Triple-Band Low_Jitter Digital LC PLL With Programmable Coil in 130-nm CMOS," *IEEE J. Solid-State Circuits*, Vol. 40, No. 7, pp. 1482-1490, June 2000.

[3] Staszewski, U.S. Pat. No. 6,429,693 B1, United States Patent, Aug. 6, 2002

[4] Federico Baronti, Luca Fanucci, Diego Lunardini, Roberto Roncella, and Roberto Saletti, "A Technique for Nonlinearity Self-Calibration of DLLs," *IEEE Trans. On Instrumentation and Measurement*, vol. 52, no. 4, August 2003.

[5] Ping-Ying Wang, Meng-Ta Yang, Shang-Ping Chen, Meng-Hsuch Lin, Jing-Bing Yang, "RTL Based Clock Recovery Architecture with All-Digital Duty-Cycle Correction," *ISSCC*, 2007.

[6] Linsay Kleeman, The jitter model for metastability and its application to redundant synchronizers, *IEEE Transaction on Computers*, 39(7):"930-942", July 1990.

The invention claimed is:

1. A fractional-N digital phase locked loop configured to receive a reference clock signal and a channel control word, and to generate an output clock signal, the fractional-N digital phase locked loop comprising:
   an adjustable delay component configured to receive the reference clock signal, apply a time delay to the received reference clock signal in accordance with a time delay control signal, and provide a delayed reference clock signal;
   a timing component configured to process the delayed reference clock signal and the output clock signal, and generate a first control signal representative of a phase of the output clock signal;
   a reference accumulator configured to receive the channel command word and generate a second control signal representative of a phase of an intended output clock signal, and the time delay control signal such that the delayed reference clock signal is delayed by a period of time representative of a first portion of the phase of the intended output clock signal;
   a controller configured to process the first and second control signals, and generate a digitally controlled oscillator (DCO) control signal for setting a DCO frequency in accordance with the first and second control signals; and
   a DCO configured to generate the output clock signal in accordance with the generated DCO control signal.

2. The fractional-N digital phase locked loop of claim 1, wherein the first portion of the intended output clock signal represents a value that is less than a quantization magnitude of the timing component.

3. The fractional-N digital phase locked loop of claim 1, wherein the first portion of the intended output clock signal represents a fractional portion of the intended output clock signal, and the timing component is configured to generate the first control signal in accordance with its quantization magnitude, which is representative of an integer portion of the intended output clock signal.

4. The fractional-N digital phase locked loop of claim 1, wherein the first control signal is representative of whether the phase of the output clock signal precedes or succeeds the delayed reference clock signal.

5. The fractional-N digital phase locked loop of claim 1, wherein the digital phase locked loop is configured to operate as a bang-bang phase locked loop.

6. The fractional-N digital phase locked loop of claim 1, wherein the adjustable delay component is configured to apply dynamic element matching.

7. The fractional-N digital phase locked loop of claim 1, further comprising:
a digital filter configured to filter the DCO control signal in order to provide a time-averaged value of the DCO control signal for setting the frequency of the DCO.

8. The fractional-N digital phase locked loop of claim 1, further comprising:
a processor configured to receive the second control signal and generate a quantization error signal representative of the quantization error of the adjustable delay component, wherein the controller is further configured to process the quantization error signal in order to generate the DCO control signal.

9. The fractional-N digital phase locked loop of claim 1, further comprising:
a processor configured to perform a spectral analysis of the DCO control signal in order to determine an average unit element delay of the adjustable delay component, and generate a calibrated time delay control signal in accordance with the channel control word and the determined average unit element delay.

10. The fractional-N digital phase locked loop of claim 1, wherein the controller is a probabilistic phase detector, and at least one parameter of the probabilistic phase detector can be calibrated in accordance with at least one operational characteristic of the digital phase locked loop.

11. The fractional-N digital phase locked loop of claim 10, wherein the at least one parameter of the probabilistic phase detector comprises at least one of a jitter level and/or distribution in the digital phase locked loop.

12. The fractional-N digital phase locked loop of claim 10, wherein the operational characteristic comprises at least one of phase error and quantization error of the DTC.

13. A computer program, which when run on a computer, causes the computer to configure the fractional-N digital phase locked loop of claim 1.

14. A digital phase locked loop configured to receive a reference clock signal and a channel control word, and to generate an output clock signal, the digital phase locked loop comprising:
an adjustable delay component configured to receive the reference clock signal, apply a time delay to the received reference clock signal in accordance with a time delay control signal, and provide a delayed reference clock signal, wherein the adjustable delay component is a digital to time converter;
a timing component configured to process the delayed reference clock signal and the output clock signal, and generate a first control signal representative of a phase of the output clock signal;
a reference accumulator configured to receive the channel command word and generate a second control signal representative of a phase of an intended output clock signal, and the time delay control signal such that the delayed reference clock signal is delayed by a period of time representative of a first portion of the phase of the intended output clock signal;
a controller configured to process the first and second control signals, and generate a digitally controlled oscillator (DCO) control signal for setting a DCO frequency in accordance with the first and second control signals; and
a DCO configured to generate the output clock signal in accordance with the generated DCO control signal.

15. The digital phase locked loop of claim 14, wherein the digital to time converter is a Vernier digital to time converter.

16. A digital phase locked loop configured to receive a reference clock signal and a channel control word, and to generate an output clock signal, the digital phase locked loop comprising:
an adjustable delay component configured to receive the reference clock signal, apply a time delay to the received reference clock signal in accordance with a time delay control signal, and provide a delayed reference clock signal;
a timing, component configured to process the delayed reference clock signal and the output clock signal, and generate a first control signal representative of a phase of the output clock signal, wherein the timing component is a counter;
a reference accumulator configured to receive the channel command word and generate a second control signal representative of a phase of an intended output clock signal, and the time delay control signal such that the delayed reference clock signal is delayed by a period of time representative of a first portion of the phase of the intended output clock signal;
a controller configured to process the first and second control signals, and generate a digitally controlled oscillator (DCO) control signal for setting a DCO frequency in accordance with the first and second control signals; and
a DCO configured to generate the output clock signal in accordance with the generated DCO control signal.

* * * * *